United States Patent
Kodani et al.

(10) Patent No.: US 7,395,033 B2
(45) Date of Patent: Jul. 1, 2008

(54) RADIO COMMUNICATION APPARATUS

(75) Inventors: Mayumi Kodani, Kawasaki (JP); Toshiaki Funakubo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 613 days.

(21) Appl. No.: 11/085,080

(22) Filed: Mar. 22, 2005

(65) Prior Publication Data

US 2006/0105715 A1 May 18, 2006

(30) Foreign Application Priority Data

Nov. 12, 2004 (JP) .............................. 2004-328808

(51) Int. Cl.
*H04B 1/04* (2006.01)

(52) U.S. Cl. ................. 455/114.3; 455/127.1; 455/418; 370/345; 375/219

(58) Field of Classification Search ............. 475/114.3, 475/127.1, 127.2, 127.3, 114.2; 330/251, 330/207; 370/345, 330, 521; 375/222, 219, 375/259; 455/418

See application file for complete search history.

(56) References Cited

U.S. PATENT DOCUMENTS 6,014,374 A * 1/2000 Paneth et al. ................. 370/345
6,792,252 B2 * 9/2004 Kimball et al. .......... 455/127.3

FOREIGN PATENT DOCUMENTS

| JP | 2002-064340 A | 2/2002 |
| JP | 2002-135063 A | 5/2002 |
| JP | 2002-223131 A | 8/2002 |
| WO | 02/17586 A1 | 2/2002 |

* cited by examiner

Primary Examiner—Tony T. Nguyen
(74) Attorney, Agent, or Firm—Bingham McCutchen LLP (57) ABSTRACT

A plurality of carriers are divided into two systems, one on a low-frequency side and the other on a high-frequency side, a transmitting unit that executes processing for transmitting a signal wirelessly is provided in each of the two systems, and output lines of transmit amplifiers of each of the transmitting units are directly coupled and input to an antenna. A feedback unit on the low-frequency side feeds a low-frequency carrier signal portion contained in the transmit signal back to a distortion compensating unit on the low-frequency side, and a feedback unit on the high-frequency side feeds a high-frequency carrier signal portion contained in the transmit signal back to a distortion compensating unit on the high-frequency side. The distortion compensating units compensate for distortion on the low- and high-frequency sides.

8 Claims, 10 Drawing Sheets

RADIO COMMUNICATION APPARATUS

BACKGROUND OF THE INVENTION

This invention relates to a radio communication apparatus and, more particularly, to a radio communication apparatus in which carriers are divided into two systems, namely high- and low-frequency systems, and which has a transmitting unit in each system that executes processing for transmitting a signal wirelessly, and a distortion compensating unit in each system that compensates for distortion produced by the transmitting unit.

As the field of mobile communications systems has progressed, the quantity of signals that the radio communication apparatus is required to transceive has increased. With a multicarrier-type radio communication apparatus that transmits a number of adjacent carriers, the general approach is to increase the number of carriers to deal with an increase in quantity of transceive signals.

Figure 5:
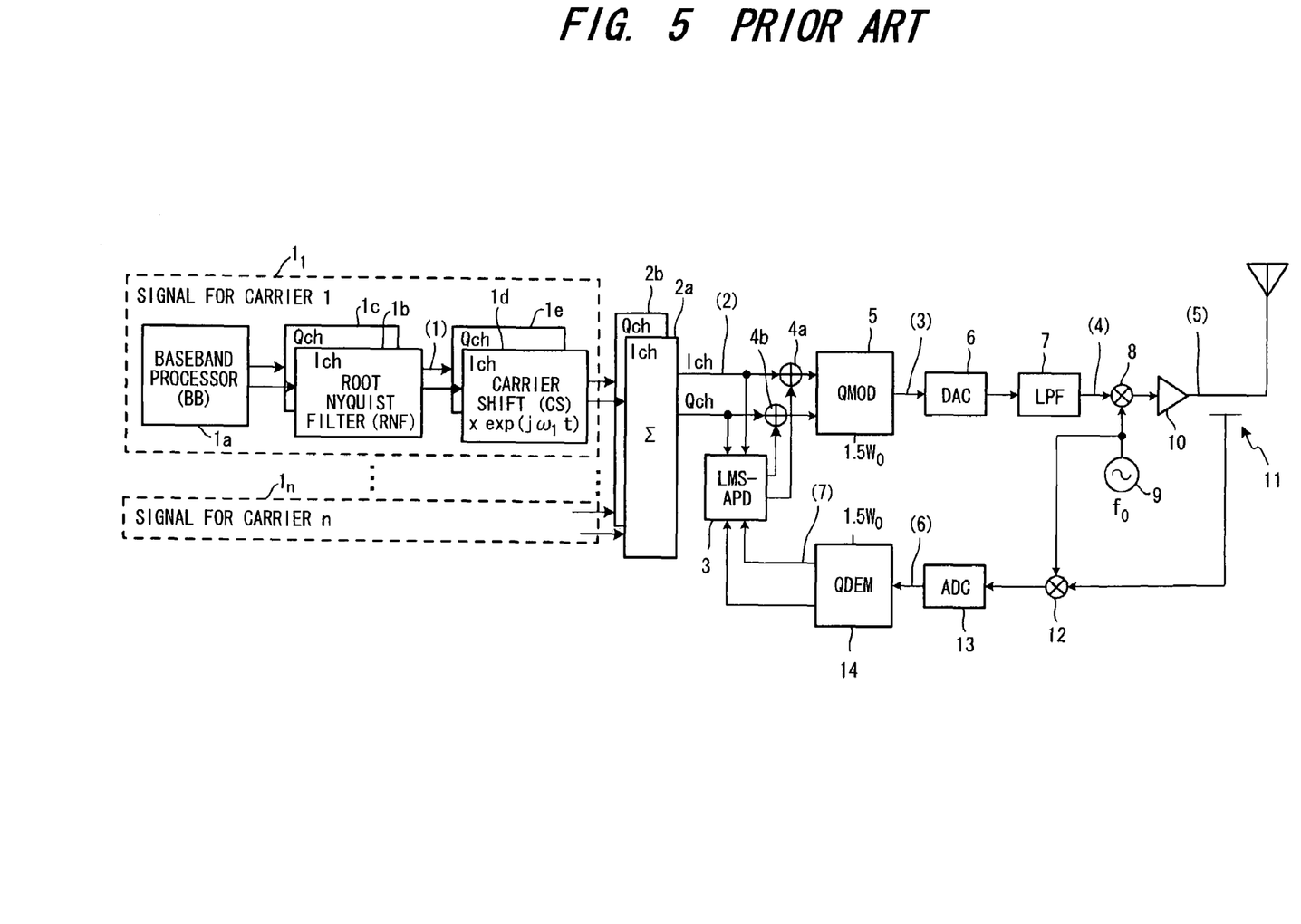
FIG. 5 is a diagram illustrating the structure of a multicarrier radio communication apparatus according to the prior art.
Figure 6:
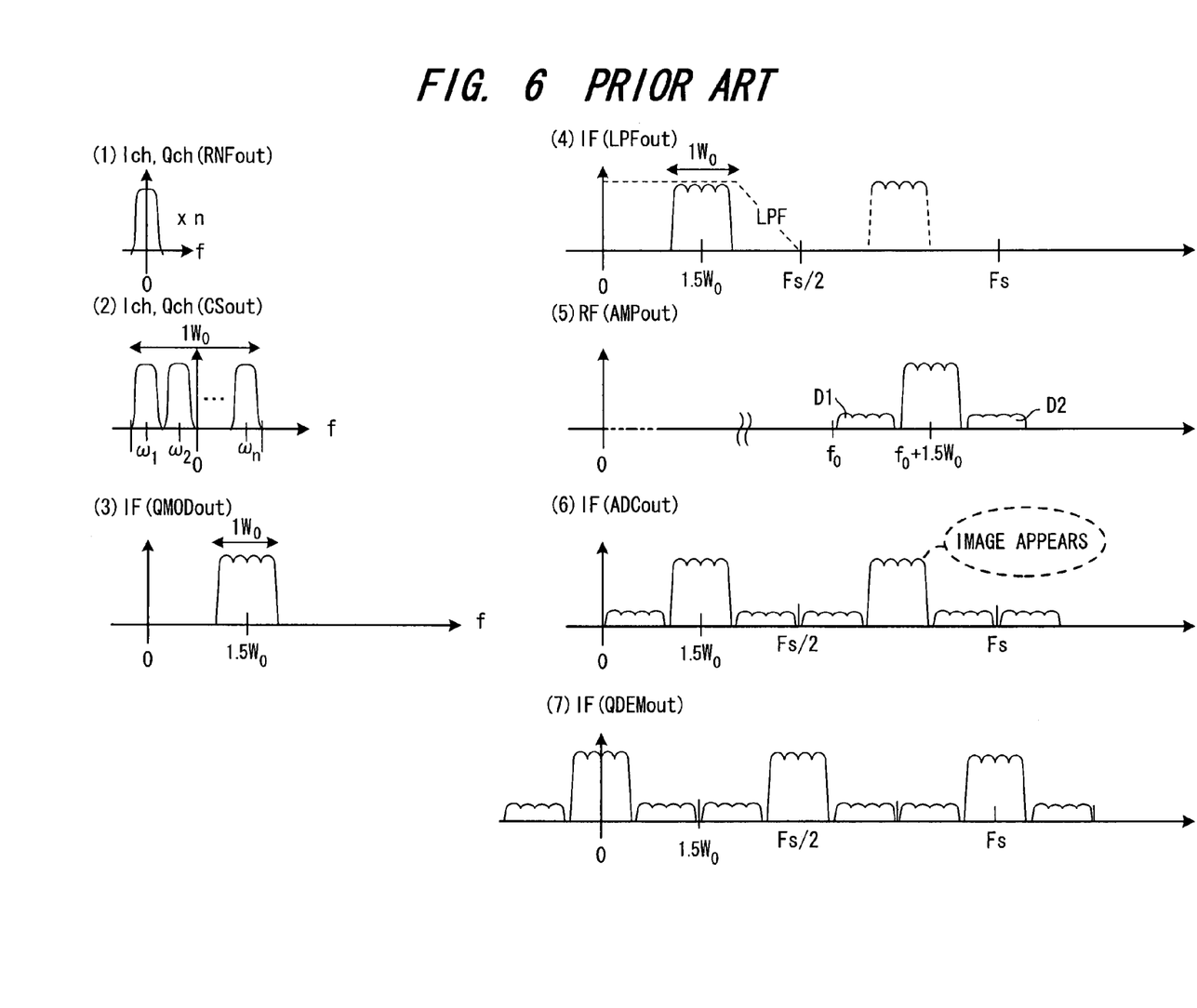
FIG. 6 is a diagram useful in describing the operation of FIG. 5.

FIG. 5 is a diagram illustrating the structure of a first multicarrier-type radio communication apparatus according to the prior art, and FIG. 6 is a diagram useful in describing the operation of this apparatus, in which (1) to (7) illustrate spectrums associated with portions identified by the same numbers in FIG. 5.

A baseband processor (BB) $1a$ in each of signal processing units $1_1$ to $1_n$ provided for respective ones of the carriers subjects data to be transmitted to baseband signal processing such as appending of error-correcting/detecting code, interleaving, multivalued modulation and code spreading and outputs a complex baseband signal. Root Nyquist filters $1b$, $1c$ apply root Nyquist filter processing to the real and imaginary parts of the complex baseband signal that enters from the baseband processor $1a$ [see (1) in FIG. 6], and carrier shifters $1d$, $1e$ multiply the real and imaginary parts of the complex baseband signal by $\exp(j\omega_j t)$ (=1 to n) to obtain and output a carrier signal of angular frequency ($\omega_j$ [see (2) in FIG. 6].

Combiners $2a$, $2b$ perform combining for every in-phase part and quadrature-phase part of each carrier and output an in-phase component Ich and quadrature-phase component Qch of the combined-carrier signal. A distortion compensating unit (APD, or Adaptive Predistortion Device) 3 generates a distortion compensating signal that compensates for distortion produced by a transmit amplifier (described later). Arithmetic units $4a$, $4b$ add the distortion compensating signal to the in-phase component Ich and quadrature-phase component Qch of the combined-carrier signal and inputs the resultant signals to a quadrature modulator 5. The latter applies quadrature modulation to the combined-carrier signal using a local signal the frequency of which is $1.5 \times W_0$, where $W_0$ represents the frequency bandwidth of the combined-carrier signal [see (3) in FIG. 6]. Owing to such quadrature modulation, each carrier frequency becomes an intermediate-frequency signal raised by $1.5 \times W_0$.

A DA converter 6 converts the signal that is output from the quadrature modulator 5 to an analog signal at a sampling frequency Fs, a low-pass filter 7 eliminates unwanted high-frequency components [see (4) in FIG. 6], and a mixer 8 multiplies the input signal by a local signal that is output from a local oscillator 9, thereby up-converting the input signal to a radio signal having a frequency ($f_0 + 1.5 \times W_0$). A transmit amplifier 10 amplifies the radio signal whose frequency has been up-converted and transmits the amplified signal via an antenna [see (5) in FIG. 6].

The transmit amplifier 10 produces distortion D1, D2 on both sides of a main signal, as indicated at (5) in FIG. 6. In order to compensate for the distortion D1, D2, a directional coupler 11 extracts part of the transmit signal, a mixer 12 multiplies the input signal by the local signal that is output from the local oscillator 9, thereby down-converting the input signal to an intermediate-frequency signal of frequency $1.5 \times W_0$, and an AD converter 13 samples the input signal at a frequency Fs of $6 \times W_0$ and converts the signal to a digital signal [see (6) in FIG. 6]. A higher-order spectrum is generated (an image appears) by the AD conversion at the sampling frequency $F_s$. A quadrature demodulator 14 applies quadrature demodulation to the output signal of the AD converter using the local signal of frequency $1.5 \times W$ [see (7) in FIG. 6] and inputs the demodulated signal to the distortion compensating unit 3.

Figure 7:
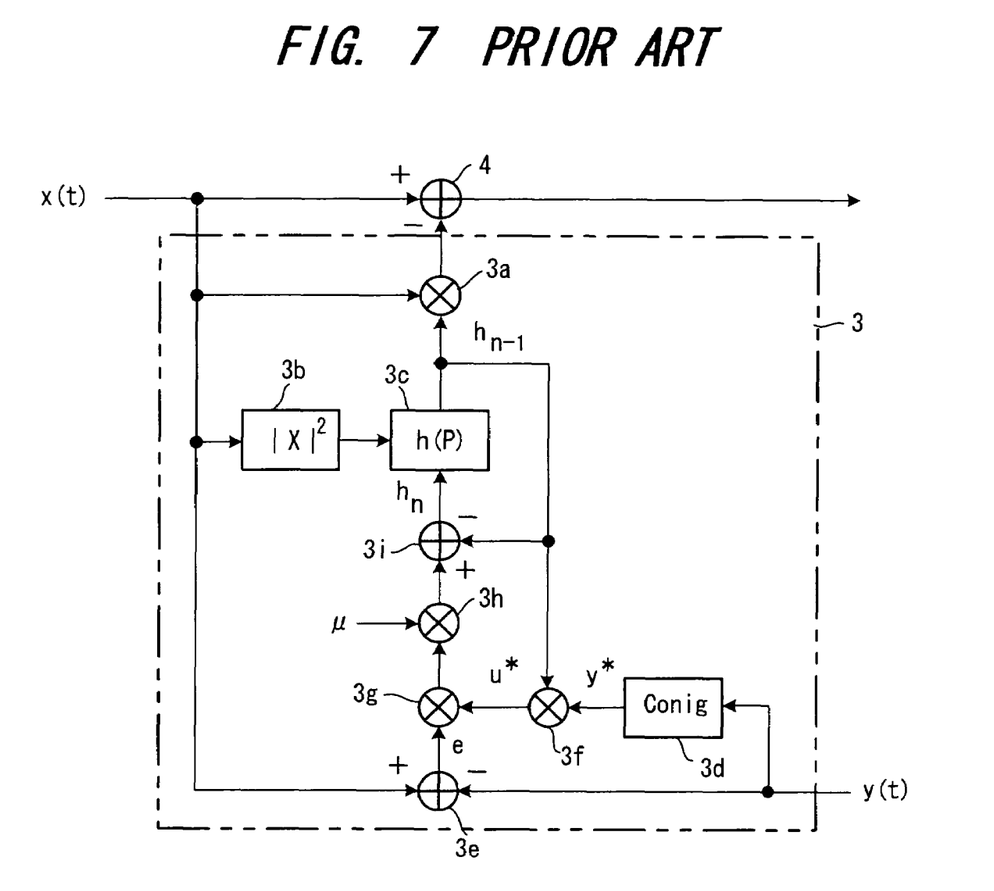
FIG. 7 illustrates an example of the structure of a distortion compensating unit.

The distortion compensating unit 3 generates a distortion compensating signal for removing distortion in the transmit amplifier 10 using an adaptive algorithm, appends the distortion compensating signal to the transmit signal and eliminates the distortion D1, D2 on both sides of the main signal [see (5) in FIG. 6]. FIG. 7 illustrates an example of the structure of the distortion compensating unit 3, which is an adaptive predistortion device. A multiplier $3a$ multiplies a transmit signal x(t), which is output from the combiners $2a$, $2b$, by a distortion compensation coefficient $h_{n-1}(p)$, and an arithmetic unit 4 subtracts a distortion compensating signal $h_{n-1} \cdot s(t)$ from the transmit signal x(t), thereby outputting power p [$=h_n(p)x(t) - x(t)$] of the transmit signal x(t) after compensation. An arithmetic unit $3b$ calculates power p [$=x(t)2$] of the transmit signal x(t), and a distortion compensation coefficient storage unit $3c$ stores a distortion compensation coefficient h(p) conforming to each power of the transmit signal x(t) and outputs the distortion compensation coefficient $h_{n-1}(p)$ conforming to the power p of the transmit signal x(t). Further, the distortion compensating coefficient storage unit $3c$ updates the distortion compensation coefficient $h_{n-1}(p)$ by the distortion compensation coefficient $h_n(p)$ obtained by an LMS algorithm. A complex-conjugate signal output unit $3d$ outputs a complex-conjugate signal of a feedback demodulated signal y(t) that enters from the quadrature demodulator 14, and a subtractor $3e$ outputs the difference e(t) between the transmit signal x(t) and the feedback demodulated signal y(t). A multiplier $3f$ multiplies $h_{n-1}(p)$ and y*(t) together and outputs u*(t). A multiplier $3g$ multiplies e(t) and u*(t) together, a multiplier $3h$ multiplies the output signal of the multiplier $3g$ by a step-size parameter µ, and an adder $3i$ adds $h_{n-1}(p)$ and µe(t)u*t and inputs the resultant signal to the distortion compensating coefficient storage unit $3c$. A calculation in accordance with the LMS algorithm set forth below is performed by the arrangement described above.

$$h_n(p) = h_{n-1}(p) + \mu e(t) u^*(t) \quad (1)$$

$$e(t) = x(t) - y(t)$$

$$y(t) = h_{n-1}(p) x(t) f(p)$$

$$u(t) = x(t) f(p) \approx h^*_{n-1}(p) y(t) h_{n-1}(p) \; h^*_{n-1}(p) \approx 1$$

$$p = |x(t)|^2$$

where:
x(t): transmit signal
f(p): distortion function of transmit amplifier
h(p): estimated distortion compensation coefficient
µ: step-size parameter
y(t): feedback signal
u(t): distorted signal
Further, x, y, f, h, u, e represent complex numbers and * signifies a complex conjugate. On the assumption that amplitude distortion of the amplifier is not very large [$h_{n-1}(p) \cdot h^*_{n-1}(p) \approx 1$], u(t) approximates $h^*_{n-1}(p) \cdot y(t)$. By executing the above-described processing, the distortion compensation coefficient h(p) is updated by Equation (1) in such a manner that the power of the difference e(t) between the transmit signal x(t) and the feedback signal y(t) will be minimized, and h(p) eventually converges to the optimum distortion compensation coefficient so that compensation is made for the distortion in the power amplifier 4.

With the arrangement of FIG. 5, a problem which arises is that when it is attempted to increase the number of carriers, there is a limitation upon the digital processing units, especially upon the sampling frequency Fs of the DA and AD conversions. For example, it order to double the number of carriers, it is necessary that the sampling frequency Fs of the digital units be doubled ($Fs=12 \times W_0$). That is, since the sampling frequency Fs prior to doubling of the number of carriers is $W_0$ in view of FIG. 6, $Fs=12 \times W_0$ will hold if the number of carriers is doubled.

Figure 8:
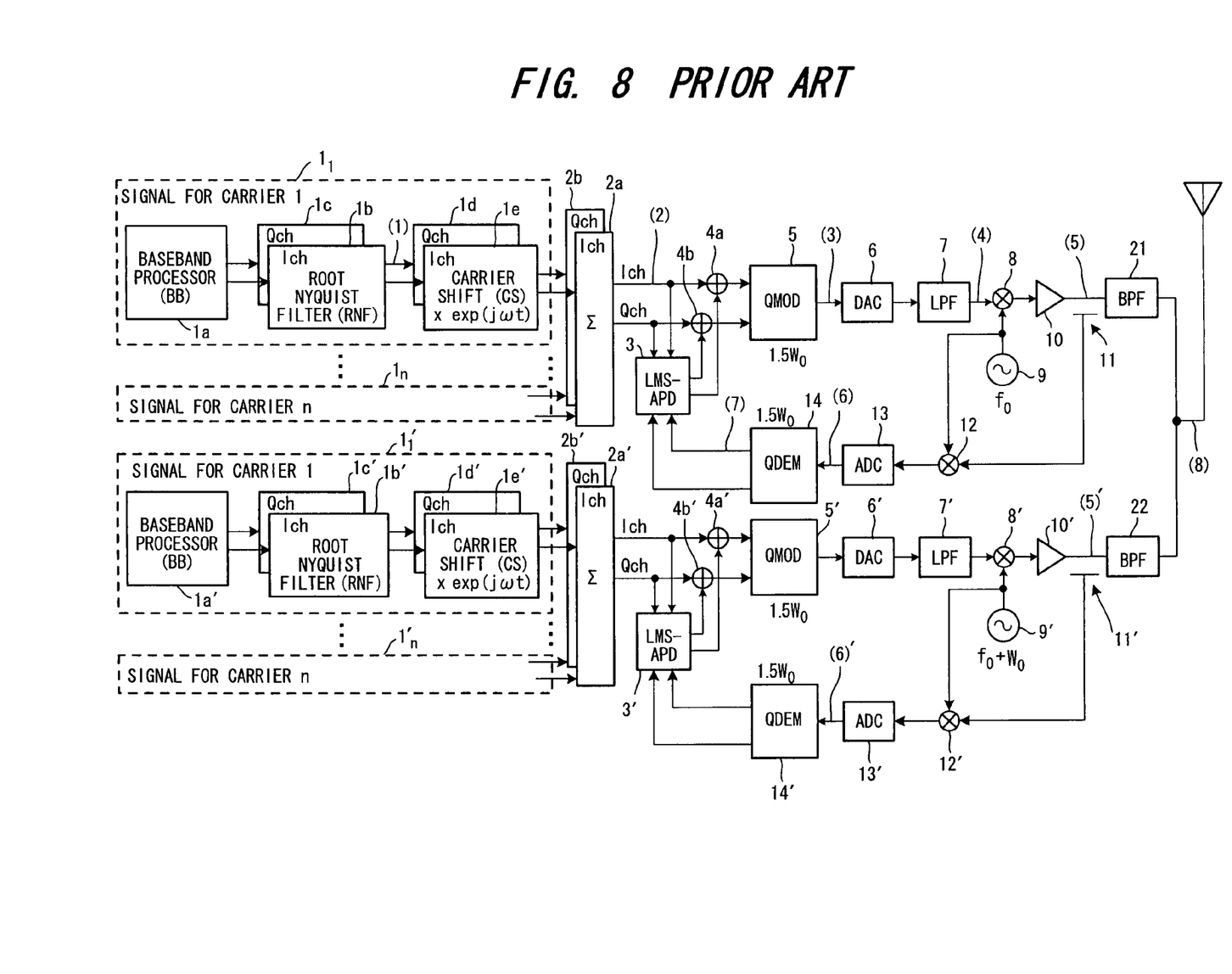
FIG. 8 is a diagram illustrating another structure of a multicarrier radio communication apparatus according to the prior art.

Thus, generally the sampling frequency of an AD converter represents a bottleneck. In a case where the frequency is not made higher, it is contemplated, as shown in FIG. 8, to split the carriers into two systems, namely systems on the low- and high-frequency sides, execute processing for transmitting a signal wirelessly in each system, and unite the processed signals through bandpass filters (BPF) 21, 22 downstream of transmit amplifiers 10, 10'. It should be noted that the radio communication apparatus shown in FIG. 8 is not well-known art.

In the multimedia-type radio communication apparatus of FIG. 8, the transmitting unit on the low-frequency side (the transmitting unit in the upper half of FIG. 8) is identical with that of the first example of the prior art shown in FIG. 5, and like components are designated by the same reference characters. Further, the transmitting unit on the high-frequency side (the transmitting unit in the lower half of FIG. 8) structurally is identical with that of the first example of the prior art shown in FIG. 5, and like components are designated by the same reference characters having "'" appended thereto. The sampling frequency Fs of the DA converters 6, 6' and AD converters 13, 13' is $6 \times W_0$, which is the same as the frequency prior to an increase in number of carriers. The transmitting unit on the high-frequency side differs from the transmitting unit on the low-frequency side in that whereas the local oscillator 9 on the low-frequency side generates a local signal of frequency $f_0$, the local oscillator 9' on the high-frequency side generates a local signal of frequency ($f_0+W_0$).

Figure 9:
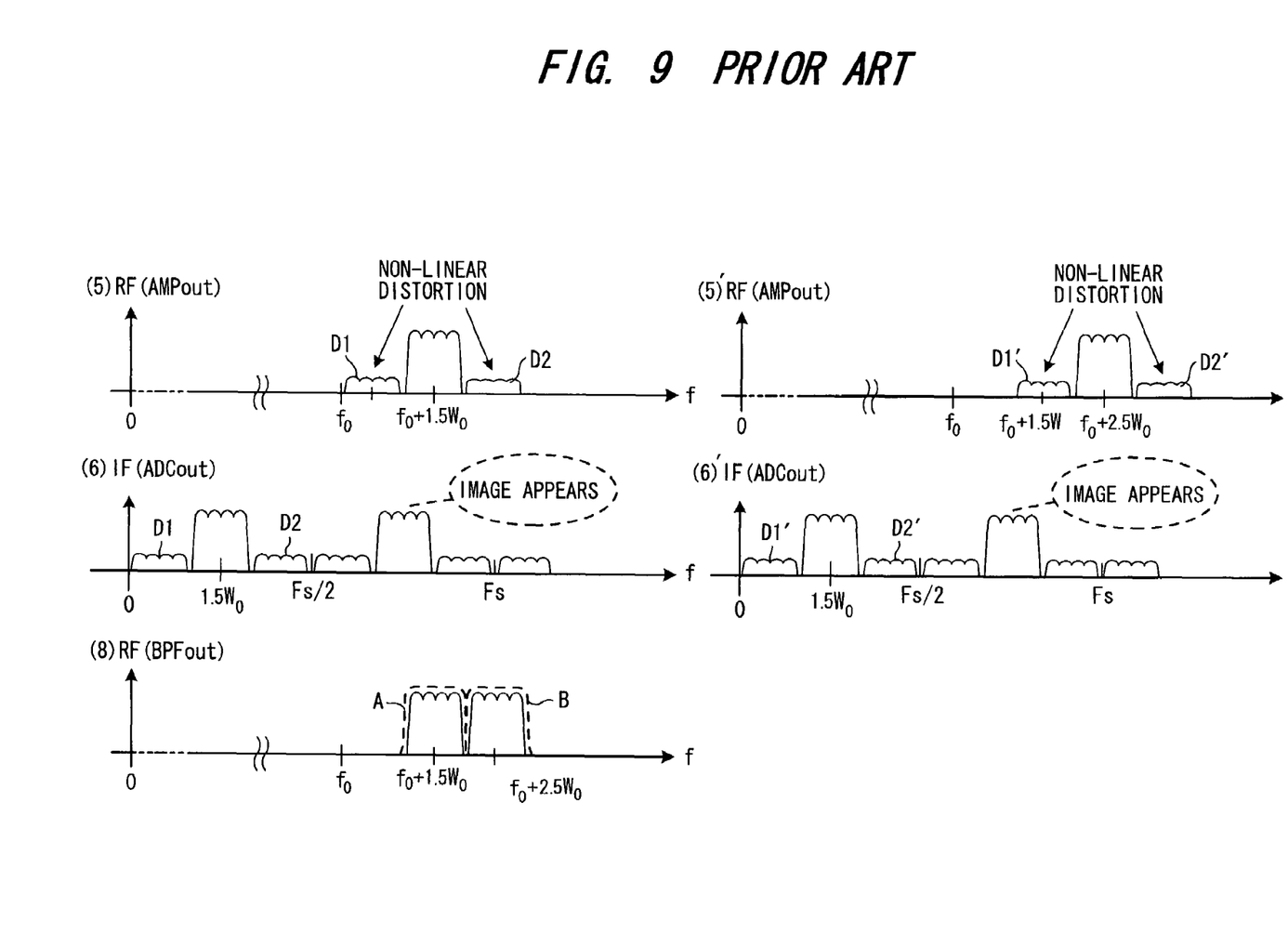
FIG. 9 is a diagram useful in describing the operation of FIG. 5.

FIG. 9 is a diagram useful in describing the operation of the radio communication apparatus shown in FIG. 8. In FIG. 9, (1) to (8), (5)' and (6)' indicate spectrums associated with portions identified by the same numbers in FIG. 6. The spectrums at (1) to (7) are the same as those in FIG. 6, and the spectrums of (1) to (4) and (7) are not illustrated.

The local signal frequency that is output from the local oscillator 9 on the low-frequency side is $f_0$, and the local signal frequency that is output from the local oscillator 9' on the high-frequency side is ($f_0+W_0$). As a result, the band of the main signal on the high-frequency side is greater by $W_0$ than the band of the main signal on the low-frequency side, as is evident from (5), (5)' in FIG. 9. However, since the radio signal frequency is down-converted by ($f_0+W_0$) by the mixer 12', the bands of the output signals of the AD converters 13, 13' are the same, as evident from (6), (6)' in FIG. 9.

The bandpass filters 21 and 22 have bandpass characteristics indicated by dashed lines A and B, respectively, in FIG. 9. As a result, the filters are capable of outputting radio signals that do not contain distortion D1, D2 and D1', D2'.

Thus, in accordance with the example of the arrangement shown in FIG. 8, it is possible to cope even with a doubling of the number of carriers and, moreover, distortion outside the baseband region can be eliminated. With the above arrangement, however, it is required that the analog bandpass filters 21, 22 have a very steep attenuation characteristic in order to so arrange it that the signal from the low-frequency side will not flow into the high-frequency side and the signal from the high-frequency side will not flow into the low-frequency side. The problem which arises is that this is not realistic. Furthermore, eliminating the bandpass filters 21, 22 and relying upon direct coupling (wire coupling) is conceivable. If the bandpass filters 21, 22 are eliminated, however, the two signals will flow mutually into the transmit amplifiers 10, 10' and third- and fifth-order intermodulation $IM_1$ to $IM_4$ will occur, as shown in FIG. 10.

Figure 10:
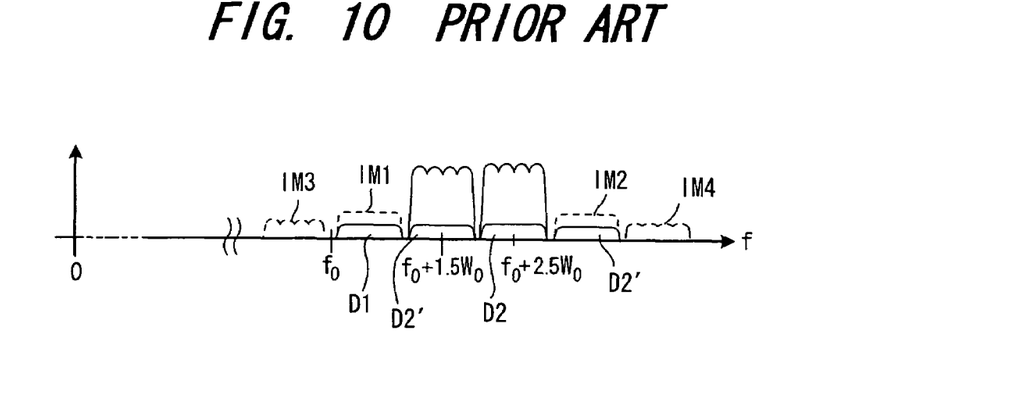
FIG. 10 is a diagram useful in describing intermodulation distortion that occurs when output lines of transmit amplifiers on low- and high-frequency sides are directly connected (wire connected)
Figure 11:
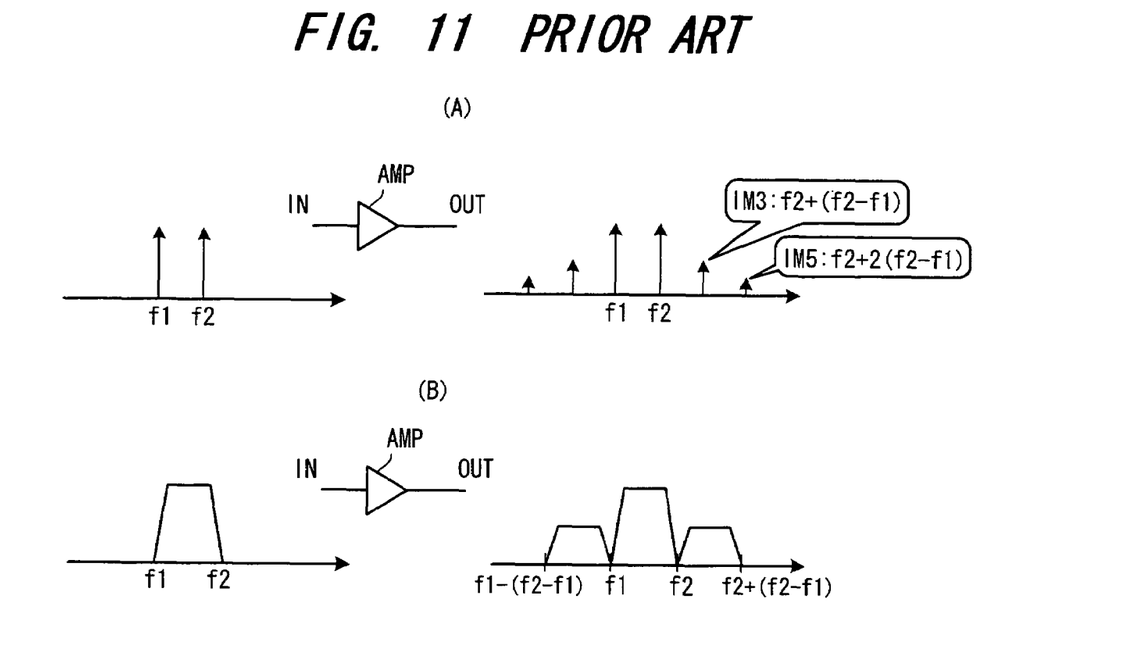
FIG. 11 is a diagram useful in describing the principle underlying the occurrence of intermodulation distortion.

Intermodulation distortion is a phenomenon in which when the signals of two waves enter a passive element such as an amplifier AMP, a distorted signal is produced where the frequency intervals of the two waves are separated, as illustrated at (A) in FIG. 10. If the intermodulation distortion is third-order intermodulation distortion, then it occurs at a frequency of $f_2+(f_2-f_1)$; if the intermodulation distortion is fifth-order intermodulation distortion, then it occurs at a frequency of $f_2+2(f_2-f_1)$. If a modulated wave is considered to be a set of line spectrums, then, as a result of each line spectrum producing intermodulation distortion, distorted signals will be produced on both sides of the modulated wave, as indicated at (B) in FIG. 11, because a similar principle is at work.

Prior art for eliminating intermodulation produced when a plurality of signals have entered a transmit amplifier has been proposed in addition to the prior art of FIG. 5 and the arrangement shown in FIG. 8 (see the specification of JP 2002-64340A). This prior art, which has a loop for feeding the output signal of a power amplifier back to first and second distortion compensating units, feeds back low-frequency components of the output signal of the power amplifier to the first distortion compensating unit via a low-pass filter, thereby compensating for intermodulation distortion that occurs on the low-frequency side, and feeds back high-frequency components of the output signal of the power amplifier to the second distortion compensating unit via a high-pass filter, thereby compensating for intermodulation distortion that occurs on the high-frequency side.

The prior art of FIG. 5 is such that if an attempt is made to increase the number of carriers, a problem which arises is that there is a limitation upon the sampling frequency Fs of the DA and AD conversions. The number of carriers that can be added on is limited by this limitation on the sampling frequency.

The example of the arrangement of FIG. 8 is such that the analog bandpass filters require a very steep attenuation characteristic.

The prior art disclosed in the reference cited above eliminates intermodulation distortion but it is not art for increasing frequency. Further, this prior art does not eliminate intermodulation distortion produced when multicarriers are divided into two systems, namely systems on low- and high-frequency sides, and outputs of transmit amplifiers in transmitting units provided in respective ones of the systems are directly coupled.

SUMMARY OF THE INVENTION

Accordingly, an object of the present invention is to provide a radio communication apparatus in which the number of carriers can be increased while an increase in sampling frequency necessary for AD conversion and the like is suppressed.

Another object of the present invention is to provide a radio communication apparatus in which the number of carriers can be increased even if bandpass filters having a steep attenuation characteristic are not used.

A further object of the present invention is to provide a radio communication apparatus that is capable of eliminating intermodulation distortion produced when multicarriers are divided into two systems, namely systems on low- and high-frequency sides, and outputs of transmit amplifiers in transmitting units provided in respective ones of the systems are directly coupled.

In accordance with the present invention, the foregoing object is attained by providing a radio communication apparatus in which a plurality of carriers are divided into two systems, one on a low-frequency side and the other on a high-frequency side, and which has a transmitting unit in each system that executes processing for transmitting a signal wirelessly, and a distortion compensating unit in each system that compensates for distortion produced in the transmit signal, said apparatus comprising: a coupler for directly coupling, and inputting to a single antenna, final stages of respective ones of the transmitting units; and feedback units for feeding a transmit signal, which is input to the antenna, back to respective ones of the compensating units of the two systems; wherein the feedback unit on the low-frequency side feeds a carrier signal portion on the low-frequency side contained in the transmit signal back to the distortion compensating unit on the low-frequency side, and the feedback unit on the high-frequency side feeds a carrier signal portion on the high-frequency side contained in the transmit signal back to the distortion compensating unit on the high-frequency side.

In the radio communication apparatus described above, each the transmitting units on the low- and high-frequency sides includes: a combiner for combining a plurality of carrier signals; a quadrature modulator for applying quadrature modulation to the combined signal using a local signal having a frequency of $1.5W_0$ or greater, where $W_0$ represents the frequency bandwidth of the combined signal; and a frequency converter for up-converting the frequency of a signal, which is output from the quadrature modulator, to radio frequency. In this case, if the frequency converter on the low-frequency side raises the frequency by $f_0$, then the frequency converter on the high-frequency side raises the frequency by $(f_0+W_0)$.

The feedback unit on the low-frequency side includes a frequency converter for down-converting the frequency of the antenna input signal by an amount by which the frequency converter of the transmitting unit on the low-frequency side up-converted the frequency, a digital converter for converting an output of this frequency converter to a digital signal, and a low-pass filter for passing, and inputting to the distortion compensating unit on the low-frequency side, the carrier signal portion on the low-frequency side contained in a signal that is output from this digital converter; and the feedback unit on the high-frequency side includes a frequency converter for down-converting the frequency of the antenna input signal by an amount by which the frequency converter of the transmitting unit on the high-frequency side up-converted the frequency, a digital converter for converting an output of this frequency converter to a digital signal, and a high-pass filter for passing, and inputting to the distortion compensating unit on the high-frequency side, the carrier signal portion on the high-frequency side contained in a signal that is output from this digital converter.

In an alternative structure for the transmitting units on the low- and high-frequency sides in the radio communication apparatus described above, each the transmitting units on the low- and high-frequency sides includes a combiner for combining a plurality of carrier signals; a quadrature modulator for applying quadrature modulation to the combined signal, which has undergone distortion compensation by the distortion compensating units, using a local signal having a frequency of $1.5W_0$, where $W_0$ represents the frequency bandwidth of the combined signal; and a frequency converter for up-converting the frequency of a signal, which is output from the quadrature modulator, to radio frequency. In this case, if the frequency converter on the low-frequency side has raised the frequency by $f_0$, then the frequency converter on the high-frequency side raises the frequency by $(f_0+W_0)$.

Further, in accordance with the present invention, the foregoing object is attained by providing a radio communication apparatus, which has a first system for amplifying a signal for a first transmission band and a second system for amplifying a signal for a second transmission band having a frequency higher than that of the first system, for transmitting a signal of the first transmission band and a second of the second transmission band after amplification of these signals to a common antenna as a transmit signal, the apparatus comprising: a first pre-distortion compensating unit for applying pre-distortion compensation processing to a signal that is input to the first system; a second pre-distortion compensating unit for applying pre-distortion compensation processing to a signal that is input to the second system; a low-pass filter, which is provided for a signal that has been obtained by applying a first frequency conversion to a feedback signal obtained by feeding back the transmit signal after amplification thereof, having a region that passes the signal for the first transmission band and a region that blocks the signal for the second transmission band; and a high-pass filter, which is provided for a signal that has been obtained by applying a second frequency conversion to a feedback signal obtained by feeding back the transmit signal after amplification thereof, having a region that passes the signal for the second transmission band and a region that blocks the signal for the first transmission band; wherein an output from the low-pass filter is applied to the first pre-distortion compensating unit and an output from the high-pass filter is applied to the second pre-distortion compensating unit.

In accordance with the present invention, a plurality of carriers are divided into two systems, one on a low-frequency side and the other on a high-frequency side, and the outputs of transmit amplifiers of transmitting units provided in respective ones of the systems are coupled (e.g., directly coupled) and transmitted. As a result, the number of carriers can be increased without increasing the sampling frequency necessary for AD conversion or the like, as is done in the first example of the prior art.

Further, in accordance with the present invention, the final stages of each of the transmitting units are coupled and input to a single antenna, the carrier signal portion on the low-frequency side contained in the transmit signal that enters the antenna is fed back to a compensating unit on the low-frequency side, the carrier signal portion on the high-frequency side contained in the transmit signal that enters the antenna is fed back to a compensating unit on the high-frequency side, low- and high-frequency distortion is eliminated by each of the distortion compensating units. As a result, the number of multicarriers can be increased even though bandpass filters having a steep attenuation characteristic are not used. Moreover, it is possible to eliminate intermodulation distortion produced when the outputs of the transmit amplifiers of the transmitting units provided in respective ones of the systems are directly coupled.

Other features and advantages of the present invention will be apparent from the following description taken in conjunction with the accompanying drawings.

DESCRIPTION OF THE PREFERRED EMBODIMENTS (A) Overview of the Present Invention

A plurality of carriers are divided into two systems, one on a low-frequency side and the other on a high-frequency side, a transmitting unit that executes processing for transmitting a signal wirelessly and a distortion compensating unit that compensates for distortion produced in the transmit signal are provided in each system. The output lines of transmit amplifiers in each of the transmitting units are coupled (directly coupled as by wire coupling) and connected to the input of a single antenna. A feedback unit on the low-frequency side feeds a carrier signal portion on the low-frequency side contained in the transmit signal back to the distortion compensating unit on the low-frequency side, and this distortion compensating unit compensates for distortion that includes intermodulation distortion on the low-frequency side. Meanwhile, a feedback unit on the high-frequency side feeds a carrier signal portion on the high-frequency side contained in the transmit signal back to the distortion compensating unit on the high-frequency side, and this distortion compensating unit compensates for distortion that includes intermodulation distortion on the high-frequency side.

(B) First Embodiment

Figure 1:
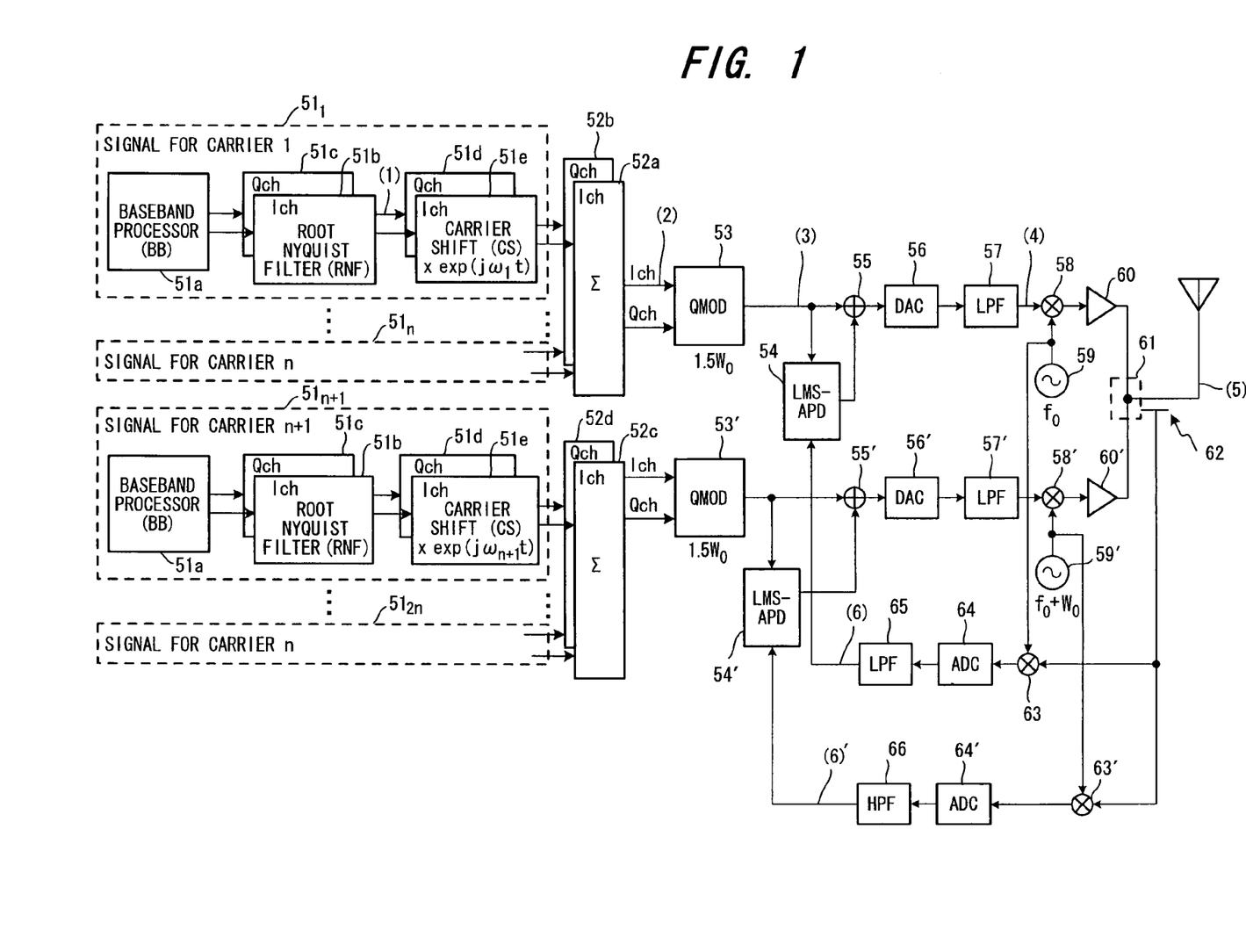
FIG. 1 is a block diagram illustrating a radio communication apparatus according to a first embodiment of the present invention.

FIG. 1 is a block diagram of a radio communication apparatus according to a first embodiment of the present invention.

Figure 2:
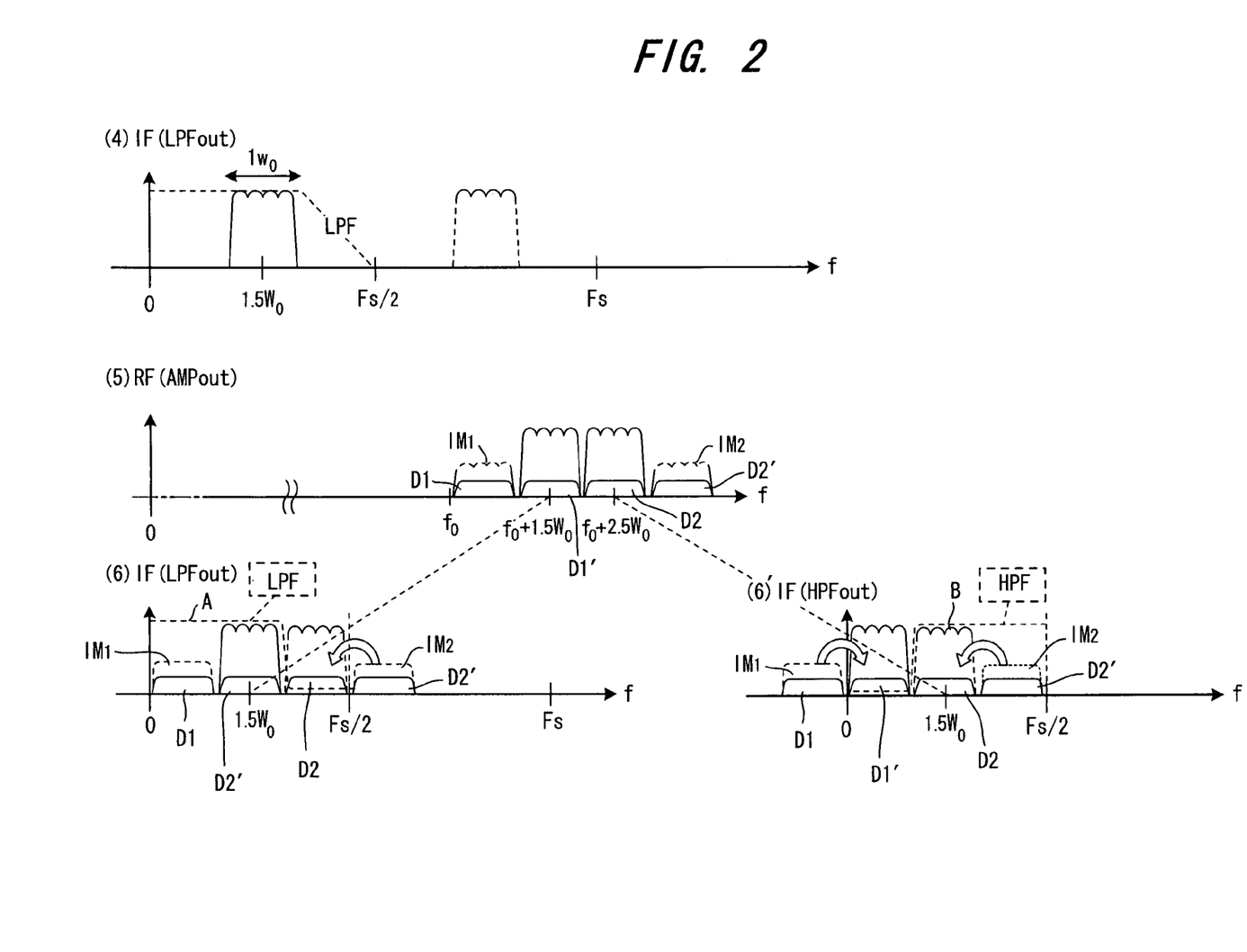
FIG. 2 is a diagram useful in describing the operation of the first embodiment.

FIG. 2 is a diagram useful in describing the operation of this apparatus, in which (4) to (6)' illustrate spectrums associated with portions identified by the same numbers in FIG. 1. Since the spectrums (1) to (3) in FIG. 2 are identical with those of the example of the prior art, these are not illustrated here (see FIG. 6).

A plurality, i.e., 2n-number, of carriers are divided into two systems, namely n-number of carriers on the low-frequency side and n-number of carriers on the high-frequency side. A baseband processor (BB) $51a$ in each of signal processing units $51_1$ to $51_n$ provided for respective ones of the n carriers on the low-frequency side subjects data to be transmitted to baseband signal processing such as appending of error-correcting/detecting code, interleaving, multivalued modulation and code spreading and outputs a complex baseband signal. Root Nyquist filters $51b$, $51c$ apply root Nyquist filter processing to the real and imaginary parts of the complex baseband signal that enters from the baseband processor $51a$ [see (1) in FIG. 6], and carrier shifters $51d$, $51e$ multiply the real and imaginary parts of the complex baseband signal by exp($j\omega_j t$) (j=1 to n) to obtain and output a carrier signal of angular frequency $\omega_j$ [see (2) in FIG. 6].

Combiners $52a$, $52b$ perform combining for every in-phase part and quadrature-phase part of each carrier and output an in-phase component Ich and quadrature-phase component Qch of the combined signal. A quadrature modulator 53 applies quadrature modulation to the combined-carrier signal using a local signal the frequency of which is $1.5 \times W_0$, where $W_0$ represents the frequency bandwidth of the combined-carrier signal [see (3) in FIG. 6]. Owing to such quadrature modulation, each carrier frequency becomes an intermediate-frequency signal raised by $1.5 \times W_0$. A distortion compensating unit 54 generates a distortion compensating signal that compensates for distortion, etc., produced by a transmit amplifier 60. An arithmetic unit 55 adds this distortion compensating signal to the output signal of the quadrature modulator 53 and inputs the resultant signal to a DA converter 56.

The DA converter 56 converts the distortion-compensated signal, which enters from the arithmetic unit 55, to an analog signal at a sampling frequency Fs, a low-pass filter 57 eliminates unwanted high-frequency components [see (4) in FIG. 2], and a mixer 58 multiplies the input signal by a local signal of frequency $f_0$ that is output from a local oscillator 59, thereby up-converting the input signal to a radio signal having a frequency ($f_0 + 1.5 \times W_0$). A transmit amplifier 60 amplifies the radio signal whose frequency has been up-converted and outputs the amplified signal.

The baseband processor (BB) $51a$, root Nyquist filters $51b$, $51c$ and carrier shifters $51d$, $51e$ in each of the signal processing units $51_{n+1}$ to $51_{2n}$ provided for respective ones of the n carriers on the high-frequency side operate in the same manner as those on the low-frequency side. However, the carrier shifters $51d$, $51e$ multiply the real and imaginary parts of the baseband signal by exp($j\omega_j t$) (j=n+1 to 2n) to obtain and output a carrier signal of angular frequency $\omega_j$. Combiners $52c$, $52d$ perform combining for every in-phase part and quadrature-phase part of each carrier and output an in-phase component Ich and quadrature-phase component Qch of the combined-carrier signal. A quadrature modulator 53' applies quadrature modulation to the combined-carrier signal using a local signal the frequency of which is $1.5 \times W_0$, where $W_0$ represents the frequency bandwidth of the combined-carrier signal. Owing to such quadrature modulation, each carrier frequency becomes an intermediate-frequency signal raised by $1.5 \times W_0$. A distortion compensating unit 54' generates a distortion compensating signal that compensates for distortion, etc., produced by a transmit amplifier 60'. An arithmetic unit 55' adds this distortion compensating signal to the output signal of the quadrature modulator 53' and inputs the resultant signal to a DA converter 56'.

The DA converter 56' converts the distortion-compensated signal, which enters from the arithmetic unit 55', to an analog signal at the sampling frequency Fs, a low-pass filter 57' eliminates unwanted high-frequency components, and a mixer 58' multiplies the input signal by a local signal of frequency $(f_0+W_0)$ that is output from a local oscillator 59', thereby up-converting the input signal to a radio signal having a frequency $(f_0+2.5\times W_0)$. The transmit amplifier 60' amplifies the radio signal whose frequency has been up-converted and outputs the amplified signal.

A direct coupler (wire coupler) 61 directly couples the output signal line of the transmit amplifier 66 in the transmitting unit on the low-frequency side and the output signal line of the transmit amplifier 60' in the transmitting unit on the high-frequency side and transmits the coupled signals via an antenna. Owing to this direct coupling, the two signals flow mutually into the transmit amplifiers 60, 60' and third-order intermodulation distortion $IM_1$, $IM_2$ occurs, as indicated at (5) in FIG. 2. Although fifth-order intermodulation distortion also occurs, this is not illustrated. It should be noted that D1, D2 indicate distortion produced by the transmit amplifier 60 and that D1', D2' indicate distortion produced by the transmit amplifier 60'.

In order to eliminate the distortion D1, D1' and third-order intermodulation distortion $IM_1$, a directional coupler 62 extracts part of the transmit signal, a mixer 63 multiplies the input signal by the local signal that is output from the local oscillator 59, thereby down-converting the input signal to an intermediate-frequency signal of frequency $1.5\times W_0$, and an AD converter 64 samples the input signal at a frequency Fs of $6\times W_0$ and converts the signal to a digital signal. A low-pass filter 65, which has a low-pass characteristic indicated by the dashed line A at (6) in FIG. 2, inputs the distortion D1, D1' and third-order intermodulation distortion $IM_1$ to the distortion compensating unit 54 together with the main signal on the low-frequency side. The distortion compensating unit 54 generates a distortion compensating signal, which is for eliminating the distortion D1, D1' and third-order intermodulation distortion $IM_1$, using an LMS adaptive algorithm, and appends the distortion compensating signal to the transmit signal on the low-frequency side. The above-described operation is repeated until the distortion D1, D1' and third-order intermodulation distortion $IM_1$ is finally removed from the antenna input signal [see (5) in FIG. 2]. It should be noted that owing to the AD conversion at the sampling frequency Fs, there are also instances where a third-order intermodulation distortion $IM_1$, etc., is looped back at Fs/2. However, since this distortion is outside the pass band of the low-pass filter, it has no influence.

On the other hand, in order to compensate for the distortion D2, D2' and third-order intermodulation distortion $IM_2$, the directional coupler 62 extracts part of the transmit signal, a mixer 63' multiplies the input signal by the local signal that is output from the local oscillator 59', thereby down-converting the input signal to an intermediate-frequency signal of frequency $1.5\times W_0$, and an AD converter 64' samples the input signal at a frequency Fs of $6\times W_0$ and converts the signal to a digital signal. A high-pass filter 66, which has a high-pass characteristic indicated by the dashed line B at (6)' in FIG. 2, inputs the distortion D2, D2' and third-order intermodulation distortion $IM_2$ to the distortion compensating unit 54' together with the main signal on the high-frequency side. The distortion compensating unit 54' generates a distortion compensating signal, which is for eliminating the distortion D2, D2' and third-order intermodulation distortion $IM_2$, using an LMS adaptive algorithm, and appends the distortion compensating signal to the transmit signal on the high-frequency side. The above-described operation is repeated until the distortion D2, D2' and third-order intermodulation distortion $IM_2$ is finally removed from the antenna input signal [see (5) in FIG. 2]. It should be noted that owing to the AD conversion at the sampling frequency Fs, there are also instances where a third-order intermodulation distortion $IM_1$, etc., is looped back at a frequency of zero. However, since this distortion is outside the pass band of the high-pass filter, it has no influence.

Thus, in accordance with the first embodiment, the number of multicarriers can be increased even if the sampling frequency is not increased and even if bandpass filters not having a steep attenuation characteristic are not used. Moreover, it is possible to eliminate intermodulation distortion that is produced when the outputs of transmit amplifiers in transmitting units provided in respective ones of systems are directly coupled.

In the first embodiment, the local frequency of the quadrature modulators 53, 53' is $1.5W_0$. However, local frequency can be made greater than $1.5W_0$, e.g., $2.5W_0$. By adopting $2.5W_0$ as the local frequency and adopting $10\times W_0$ as the sampling frequency Fs, fifth-order intermodulation distortion can also be compensated for by inputting this distortion to the quadrature modulators 53, 53'.

Although steep characteristics are required as the characteristics of the low- and high-pass filters in the first embodiment, it is possible to readily design digital low- and high-pass filters having such characteristics, unlike the case with analog filters.

(C) Second Embodiment

Figure 3:
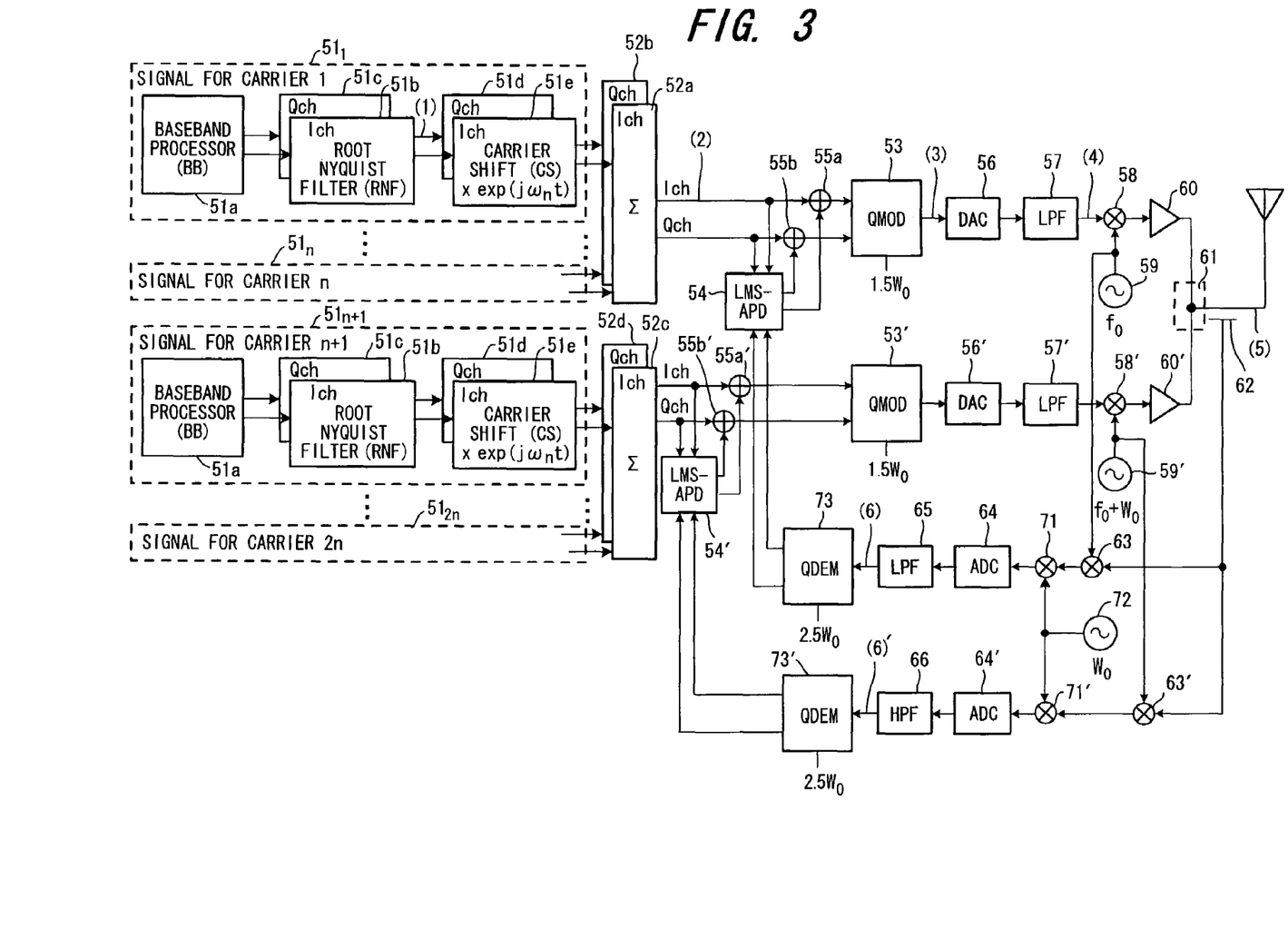
FIG. 3 is a block diagram illustrating a radio communication apparatus according to a second embodiment of the present invention.
Figure 4:
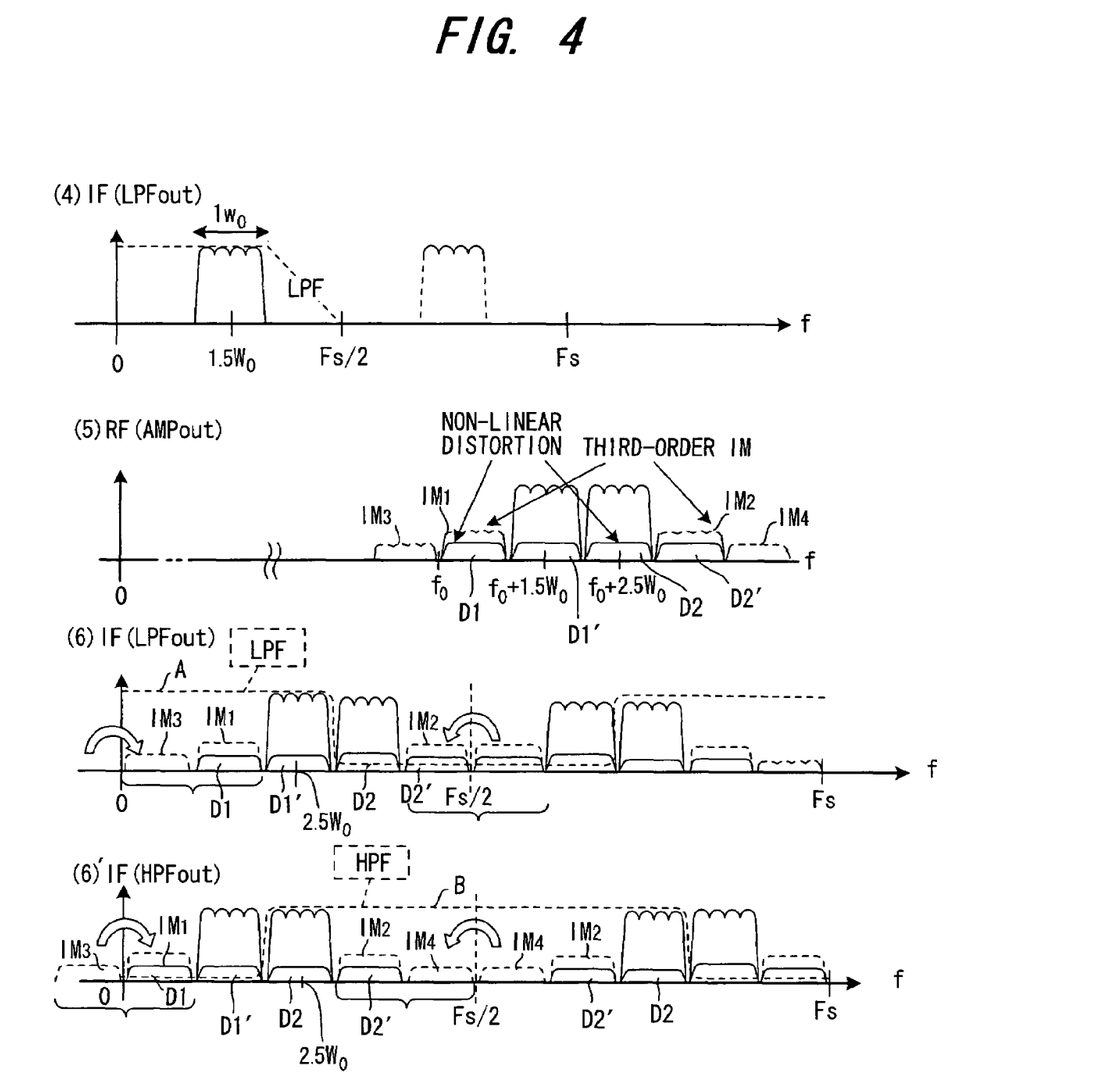
FIG. 4 is a diagram useful in describing the operation of the second embodiment.

FIG. 3 is a block diagram illustrating a radio communication apparatus according to a second embodiment of the invention. FIG. 4 is a diagram useful in describing the operation of this embodiment, in which (4) to (6)' illustrate spectrums associated with portions identified by the same numbers in FIG. 3. Since the spectrums (1) to (3) in FIG. 4 are identical with those of the example of the prior art, these are not illustrated here. Components in FIG. 3 identical with those of the first embodiment in FIG. 1 are designated by like reference characters.

The embodiment of FIG. 3 differs from the first embodiment of FIG. 1 in the following respects:

(a) The transmit signal to which the distortion compensating signal has been added by the arithmetic units 55a, 55b is input to the quadrature modulators 53, 53'.

(b) Second mixers 71, 71' and a local oscillator 72 for raising the frequency of the input signal by $W_0$ are provided downstream of the first mixers 63, 63'.

(c) Quadrature demodulators 73, 73' having a local frequency of $2.5W_0$ are provided downstream of low- and high-pass filters 65, 66, respectively, and the output signals thereof are fed back and input to the distortion compensating units 54, 54', respectively.

In the second embodiment, the directional coupler 62 extracts part of the transmit signal in order to eliminate the distortion D1, D1' and third- and fifth-order intermodulation distortion $IM_1$, $IM_3$ [see (5) in FIG. 4] contained in the antenna input signal. The mixer 63 multiplies the extracted signal by the local signal that is output from the local oscillator 59, thereby down-converting the signal to a signal of frequency $1.5\times W_0$, and the mixer 71 raises the frequency of this signal by $W_0$, thereby obtaining and outputting a signal of frequency $2.5\times W_0$.

The AD converter 64 samples the input signal at a frequency Fs of $10 \times W_0$ and converts the signal to a digital signal. The low-pass filter 65, which has a low-pass characteristic indicated by the dashed line A at (6) in FIG. 4, inputs the distortion D1, D1' and third- and fifth-order intermodulation distortion $IM_1$, $IM_3$ to the quadrature demodulator 73 together with the main signal on the low-frequency side. The quadrature demodulator 73 applies quadrature demodulation at the local frequency of $2.5 \times W_0$ and inputs the demodulated signal to the distortion compensating unit 54. The distortion compensating unit 54 generates a distortion compensating signal, which is for eliminating the distortion D1, D1' and third- and fifth-order intermodulation distortion $IM_1$, $IM_3$ using an LMS adaptive algorithm, and appends the distortion compensating signal to the transmit signal on the low-frequency side. The above-described operation is repeated until the distortion D1, D' and third- and fifth-order intermodulation distortion $IM_1$, $IM_3$ is finally removed from the antenna input signal [see (5) in FIG. 4]. It should be noted that owing to the AD conversion at the sampling frequency Fs, there are also instances where a third-order intermodulation distortion $IM_2$, etc., is looped back at Fs/2. However, since this distortion is outside the pass band of the low-pass filter, it has no influence. Further, although there are also instances where the fifth-order intermodulation distortion $IM_3$ is looped back at a frequency of zero, this distortion is eliminated by the distortion compensating unit 54.

On the other hand, in order to compensate for the distortion D2, D2' and third- and fifth-order intermodulation distortion $IM_2$, $IM_4$ [see (5) in FIG. 4] contained in the antenna input signal, the directional coupler 62 extracts part of the transmit signal. The mixer 63' multiplies the extracted signal by the local signal that is output from the local oscillator 59, thereby down-converting the signal to a signal of frequency $1.5 \times W_0$, and the mixer 71' raises the frequency of this signal by $W_0$, thereby obtaining and outputting a signal of frequency $2.5 \times W_0$.

The AD converter 64' samples the input signal at a frequency Fs of $10 \times W_0$ and converts the signal to a digital signal. The high-pass filter 66, which has a high-pass characteristic indicated by the dashed line B at (6)' in FIG. 4, inputs the distortion D2, D2' and third- and fifth-order intermodulation distortion $IM_2$, $IM_4$ to the quadrature demodulator 73' together with the main signal on the high-frequency side. The quadrature demodulator 73' applies quadrature demodulation at the local frequency of $2.5 \times W_0$ and inputs the demodulated signal to the distortion compensating unit 54'. The distortion compensating unit 54' generates a distortion compensating signal, which is for eliminating the distortion D2, D2' and third- and fifth-order intermodulation distortion $IM_2$, $IM_4$ using an LMS adaptive algorithm, and appends the distortion compensating signal to the transmit signal on the low-frequency side. The above-described operation is repeated until the distortion D2, D2' and third- and fifth-order intermodulation distortion $IM_2$, $IM_4$ is finally removed from the antenna input signal [see (5) in FIG. 4]. It should be noted that owing to the AD conversion at the sampling frequency Fs, there are also instances where a fifth-order intermodulation distortion $IM_4$ is looped back at Fs/2. However, this distortion is eliminated by the distortion compensating unit 54'. Further, although there are also instances where the fifth-order intermodulation distortion $IM_3$ is looped back at a frequency of zero, this distortion is outside the pass band of the low-pass filter and therefore has no influence.

Thus, in accordance with the second embodiment, the sampling frequency is higher in comparison with the first embodiment but it is possible to also eliminate fifth-order intermodulation distortion in addition to third-order intermodulation distortion. Further, the number of multimedia can be increased even if bandpass filters having a steep attenuation characteristic are not used.

In the second embodiment, frequency is lowered a total of $(f_0 - W_0)$ by the first and second mixers 63, 71 on the low-frequency side and is lowered a total of $f_0$ by the first and second mixers 63', 71' on the high-frequency side. Accordingly, it can be so arranged that the first and second mixers 63, 71 on the low-frequency side are combined into a single mixer to lower frequency by $f_0 - W_0$ and the first and second mixers 63', 71' on the high-frequency side are combined into a single mixer to lower frequency by $f_0$.

As many apparently widely different embodiments of the present invention can be made without departing from the spirit and scope thereof, it is to be understood that the invention is not limited to the specific embodiments thereof except as defined in the appended claims.

What is claimed is:

1. A radio communication apparatus in which a plurality of carriers are divided into two systems, one on a low-frequency side and the other on a high-frequency side, and which has a transmitting unit in each system that executes processing for transmitting a signal wirelessly, and a distortion compensating unit in each system that compensates for distortion produced in the transmit signal, said apparatus comprising:
   a coupler for directly coupling, and inputting to a single antenna, final stages of respective ones of the transmitting units; and
   feedback units for feeding a transmit signal, which is input to the antenna, back to respective ones of the compensating units of the two systems;
   wherein said feedback unit on the low-frequency side feeds a carrier signal portion on the low-frequency side contained in the transmit signal back to said distortion compensating unit on the low-frequency side, and said feedback unit on the high-frequency side feeds a carrier signal portion on the high-frequency side contained in the transmit signal back to said distortion compensating unit on the high-frequency side.

2. The apparatus according to claim 1, wherein each of said transmitting units on the low- and high-frequency sides includes:
   a combiner for combining a plurality of carrier signals;
   a quadrature modulator for applying quadrature modulation to the combined signal using a local signal having a frequency of $1.5 W_0$ or greater, where W0 represents the frequency bandwidth of the combined signal; and
   a frequency converter for up-converting the frequency of a signal, which is output from said quadrature modulator, to radio frequency.

3. The apparatus according to claim 2, wherein if the frequency converter on the low-frequency side has raised the frequency by f0, then the frequency converter on the high-frequency side raises the frequency by (f0+W0).

4. The apparatus according to claim 2, wherein said feedback unit on the low-frequency side includes:
   a frequency converter for down-converting the frequency of the antenna input signal by an amount by which the frequency converter of said transmitting unit on the low-frequency side up-converted the frequency;
   a digital converter for converting an output of this frequency converter to a digital signal; and
   a low-pass filter for passing, and inputting to said distortion compensating unit on the low-frequency side, the carrier signal portion on the low-frequency side contained in a signal that is output from this digital converter; and said feedback unit on the high-frequency side includes:
a frequency converter for down-converting the frequency of the antenna input signal by an amount by which the frequency converter of said transmitting unit on the high-frequency side up-converted the frequency;
a digital converter for converting an output of this frequency converter to a digital signal; and
a high-pass filter for passing, and inputting to said distortion compensating unit on the high-frequency side, the carrier signal portion on the high-frequency side contained in a signal that is output from this digital converter.

5. The apparatus according to claim 1, wherein each of said transmitting units on the low- and high-frequency sides includes:
a combiner for combining a plurality of carrier signals;
a quadrature modulator for applying quadrature modulation to the combined signal, which has undergone distortion compensation by said distortion compensating units, using a local signal having a frequency of $1.5W_0$, where $W_0$ represents the frequency bandwidth of the combined signal; and
a frequency converter for up-converting the frequency of a signal, which is output from said quadrature modulator, to radio frequency;
the frequency converter on the low-frequency side raising the frequency by $f_0$, and the frequency converter on the high-frequency side raising the frequency by $(f_0+W_0)$.

6. The apparatus according to claim 5, wherein said feedback unit on the low-frequency side includes:
a frequency converter for lowering the frequency of an input signal a total of $(f_0-W_0)$;
a digital converter for converting an output of said frequency converter to a digital signal; and
a low-pass filter for passing the carrier signal portion on the low-frequency side contained in a signal that is output from said digital converter; and
a quadrature demodulator for applying quadrature demodulation to an output signal of said low-pass filter using a local signal having a frequency of $2.5W_0$, and inputting the demodulated signal to the distortion compensating unit on the low-frequency side; and
said feedback unit on the high-frequency side includes:
a frequency converter for lowering the frequency of an input signal a total of $f_0$;
a digital converter for converting an output of said frequency converter to a digital signal; and
a high-pass filter for passing the carrier signal portion on the high-frequency side contained in a signal that is output from said digital converter; and
a quadrature demodulator for applying quadrature demodulation to an output signal of said high-pass filter using a local signal having a frequency of $2.5W_0$, and inputting the demodulated signal to the distortion compensating unit on the high-frequency side.

7. The apparatus according to claim 1, wherein said feedback unit on the low-frequency side has a low-pass filter and inputs a distorted signal, which has been produced on the low-frequency side, to said distortion compensating unit on the low-frequency side together with a main signal on the low-frequency side, and said feedback unit on the high-frequency side has a high-pass filter and inputs a distorted signal, which has been produced on the high-frequency side, to said distortion compensating unit on the high-frequency side together with a main signal on the high-frequency side.

8. A radio communication apparatus, which has a first system for amplifying a signal for a first transmission band and a second system for amplifying a signal for a second transmission band having a frequency higher than that of the first system, for transmitting a signal of the first transmission band and a second of the second transmission band after amplification of these signals from a common antenna as a transmit signal, the apparatus comprising:
a first pre-distortion compensating unit for applying pre-distortion compensation processing to a signal that is input to the first system;
a second pre-distortion compensating unit for applying pre-distortion compensation processing to a signal that is input to the second system;
a low-pass filter provided for a signal that has been obtained by applying a first frequency conversion to a feedback signal obtained by feeding back the transmit signal after amplification thereof, said low-pass filter having a region that passes the signal for the first transmission band and a region that blocks the signal for the second transmission band; and
a high-pass filter provided for a signal that has been obtained by applying a second frequency conversion to a feedback signal obtained by feeding back the transmit signal after amplification thereof, said high-pass filter having a region that passes the signal for the second transmission band and a region that blocks the signal for the first transmission band;
wherein an output from said low-pass filter is applied to said first pre-distortion compensating unit and an output from said high-pass filter is applied to said second pre-distortion compensating unit.

* * * * *